United States Patent
Wong et al.

(10) Patent No.: US 6,291,088 B1
(45) Date of Patent: *Sep. 18, 2001

(54) INORGANIC OVERCOAT FOR PARTICULATE TRANSPORT ELECTRODE GRID

(75) Inventors: Kaiser H. Wong, Torrance; Tuan Anh Vo, Hawthorne, both of CA (US)

(73) Assignee: Xerox Corporation, Stamford, CT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,518

(22) Filed: Sep. 30, 1998

(51) Int. Cl.$^7$ .......................................... B32B 7/00
(52) U.S. Cl. .................... 428/698; 428/332; 428/446; 428/450; 252/62.3 R
(58) Field of Search ................ 501/96.5, 97.1, 501/154; 252/521.3, 62.3, 62.3 T, 62.3 R; 428/446, 698, 450, 332; 347/1, 5

(56) References Cited

U.S. PATENT DOCUMENTS

| | | | |
|---|---|---|---|
| 2,573,143 | 10/1951 | Jacob | 178/5.2 |
| 2,577,894 | 12/1951 | Jacob | 346/75 |

(List continued on next page.)

FOREIGN PATENT DOCUMENTS

| | | |
|---|---|---|
| 0 655 337 A2 | 5/1995 | (EP). |
| 0 726 158 A1 | 8/1996 | (EP). |
| 353035539A | 4/1978 | (JP). |
| 55 019556 | 2/1980 | (JP). |
| 55 028819 | 2/1980 | (JP). |
| 56 146773 | 11/1981 | (JP). |
| 58-224760 | 12/1983 | (JP). |
| 60 229764 | 11/1985 | (JP). |
| 362035847A | 2/1987 | (JP). |
| 2 293151 | 12/1990 | (JP). |
| 4-158044 | 6/1992 | (JP). |
| 4-182138 | 6/1992 | (JP). |
| 5-4348 | 1/1993 | (JP). |
| 5-193140 | 8/1993 | (JP). |
| 5-269995 | 10/1993 | (JP). |
| WO 93/11866 | 6/1993 | (WO). |
| WO 94/18011 | 8/1994 | (WO). |
| WO 97/01449 | 1/1997 | (WO). |
| WO 97/27058 | 7/1997 | (WO). |

OTHER PUBLICATIONS

F. Anger, Jr. et al. Low Surface Energy Fluoro–Epoxy Coating For Drop–On–Demand Nozzles, *IBM Technical Disclosure Bulletin*, vol. 26, No. 1, p. 431, Jun. 1983.

N. A. Fuchs. The Mechanics Of Aerosols, *Dover Publications*, Inc., pp. 79, 367–377, 1989 (Originally published in 1964 by Pergamon Press Ltd.) (no month).

Hue Le et al. Air–Assisted Ink Jet With Mesa–Shaped Ink–Drop–Forming Orifice, Presented at the Fairmont Hotel in Chicago and San Jose, Fall 1987, pp. 223–227 (no month).

No author listed, Array Printers Demonstrates First Color Printer Engine, The Hard Copy Observer Published by Lyra Research, Inc., vol. VIII, No. 4, p. 36, Apr. 1998.

*Primary Examiner*—Deborah Jones
*Assistant Examiner*—Stephen Stein

(57) ABSTRACT

An inorganic, top-surface, semiconducting dielectric overcoat, having a selected time constant permits electric field charge and dissipation at a selected rate to facilitate particulate material movement over an underlying electrode grid. The coating may be made from nitrides, oxides or oxy-nitrides of silicon, or amorphous silicon. A planarized, wear resistant, chemically stable surface, and minimized inter-electrode build-up are also provided by the overcoat.

8 Claims, 2 Drawing Sheets

U.S. PATENT DOCUMENTS

| | | | |
|---|---|---|---|
| 3,152,858 | 10/1964 | Wadey | 346/75 |
| 3,572,591 | 3/1971 | Brown | 239/337 |
| 3,977,323 | 8/1976 | Pressman et al. | 101/426 |
| 3,997,113 | 12/1976 | Pennebaker, Jr. | 239/15 |
| 4,019,188 | 4/1977 | Hochberg et al. | 346/75 |
| 4,106,032 | 8/1978 | Miura et al. | 346/140 R |
| 4,113,598 | 9/1978 | Jozwiak, Jr. et al. | 204/181 R |
| 4,171,777 | 10/1979 | Behr | 239/422 |
| 4,189,937 | 2/1980 | Nelson | 73/28 |
| 4,265,990 | 5/1981 | Stolka et al. | 430/59 |
| 4,271,100 | 6/1981 | Trassy | 261/78 A |
| 4,284,418 | 8/1981 | Andres | 55/16 |
| 4,368,850 | 1/1983 | Szekely | 239/333 |
| 4,403,228 | 9/1983 | Miura et al. | 346/75 |
| 4,480,259 | 10/1984 | Kruger et al. | 346/140 R |
| 4,490,728 | 12/1984 | Vaught et al. | 346/1.1 |
| 4,500,895 | 2/1985 | Buck et al. | 346/140 R |
| 4,514,742 | 4/1985 | Suga et al. | 346/140 R |
| 4,515,105 | 5/1985 | Danta et al. | 118/629 |
| 4,523,202 | 6/1985 | Gamblin | 346/75 |
| 4,544,617 * | 10/1985 | Mort et al. | 430/58 |
| 4,606,501 | 8/1986 | Bate et al. | 239/346 |
| 4,607,267 | 8/1986 | Yamamuro | 346/140 R |
| 4,613,875 | 9/1986 | Le et al. | 346/140 R |
| 4,614,953 | 9/1986 | Lapeyre | 345/140 R |
| 4,634,647 * | 1/1987 | Jansen et al. | 430/84 |
| 4,647,179 | 3/1987 | Schmidlin | 355/3 DD |
| 4,663,258 * | 5/1987 | Pai et al. | 430/57 |
| 4,666,806 * | 5/1987 | Pai et al. | 430/57 |
| 4,683,481 | 7/1987 | Johnson | 346/140 R |
| 4,720,444 * | 1/1988 | Chen | 430/58 |
| 4,728,969 | 3/1988 | Le et al. | 346/140 R |
| 4,741,930 | 5/1988 | Howard et al. | 427/265 |
| 4,760,005 * | 7/1988 | Pai | 430/67 |
| 4,770,963 * | 9/1988 | Pai et al. | 430/64 |
| 4,839,232 | 6/1989 | Morita et al. | 428/473.5 |
| 4,839,666 | 6/1989 | Jayne | 346/75 |
| 4,870,430 | 9/1989 | Daggett et al. | 346/140 R |
| 4,882,245 | 11/1989 | Gelorme et al. | 430/14 |
| 4,896,174 | 1/1990 | Stearns | 346/459 |
| 4,929,968 | 5/1990 | Ishikawa | 346/140 R |
| 4,961,966 | 10/1990 | Stevens et al. | 427/299 |
| 4,973,379 | 11/1990 | Brock et al. | 156/640 |
| 4,982,200 | 1/1991 | Ramsay | 346/75 |
| 5,030,536 * | 7/1991 | Pai et al. | 430/127 |
| 5,041,849 | 8/1991 | Quate et al. | 346/140 R |
| 5,045,870 * | 9/1991 | Lamey et al. | 346/140 R |
| 5,063,655 * | 11/1991 | Lamey et al. | 29/611 |
| 5,066,512 | 11/1991 | Goldowsky et al. | 427/14.1 |
| 5,113,198 | 5/1992 | Nishikawa et al. | 346/1.1 |
| 5,190,817 | 3/1993 | Terrell et al. | 428/343 |
| 5,202,704 | 4/1993 | Iwao | 346/140 R |
| 5,208,630 | 5/1993 | Goodbrand et al. | 355/201 |
| 5,209,998 | 5/1993 | Kavassalis et al. | 430/106 |
| 5,240,153 | 8/1993 | Tubaki et al. | 222/385 |
| 5,240,842 | 8/1993 | Mets | 435/172.3 |
| 5,294,946 | 3/1994 | Gandy et al. | 346/140 R |
| 5,300,339 | 4/1994 | Hays et al. | 428/36.9 |
| 5,350,616 | 9/1994 | Pan et al. | 428/131 |
| 5,363,131 | 11/1994 | Momose et al. | 347/46 |
| 5,385,803 | 1/1995 | Duff et al. | 430/138 |
| 5,403,617 | 4/1995 | Haaland | 427/180 |
| 5,425,802 | 6/1995 | Burton et al. | 95/32 |
| 5,428,381 | 6/1995 | Hadimioglu et al. | 347/46 |
| 5,482,587 | 1/1996 | McAleavey | 156/243 |
| 5,512,712 | 4/1996 | Iwata et al. | 174/258 |
| 5,520,715 | 5/1996 | Oeftering | 75/335 |
| 5,522,555 | 6/1996 | Poole | 241/33 |
| 5,535,494 | 7/1996 | Plesinger et al. | 29/25.35 |
| 5,541,625 | 7/1996 | Holstun et al. | 347/5 |
| 5,554,480 | 9/1996 | Patel et al. | 430/137 |
| 5,600,351 | 2/1997 | Holstun et al. | 347/40 |
| 5,635,969 | 6/1997 | Allen | 347/96 |
| 5,640,187 | 6/1997 | Kashiwazaki et al. | 347/101 |
| 5,654,744 | 8/1997 | Nicoloff, Jr. et al. | 347/43 |
| 5,678,133 | 10/1997 | Siegel | 399/67 |
| 5,682,190 | 10/1997 | Hirosawa et al. | 347/94 |
| 5,712,669 | 1/1998 | Swanson et al. | 347/49 |
| 5,717,986 | 2/1998 | Vo et al. | 399/291 |
| 5,731,048 * | 3/1998 | Ashe et al. | 427/585 |
| 5,756,190 | 5/1998 | Hosomi et al. | 428/209 |
| 5,761,783 | 6/1998 | Osawa et al. | 29/25.35 |
| 5,777,636 | 7/1998 | Naganuma et al. | 347/10 |
| 5,787,558 | 8/1998 | Murphy | 29/25.35 |
| 5,818,477 | 10/1998 | Fullmer et al. | 347/43 |
| 5,828,388 | 10/1998 | Cleary et al. | 347/21 |
| 5,853,906 | 12/1998 | Hsieh | 428/690 |
| 5,882,830 | 3/1999 | Visser et al. | 430/59 |
| 5,893,015 * | 4/1999 | Mojarradi et al. | 399/291 |
| 5,900,898 | 5/1999 | Shimizu et al. | 347/93 |
| 5,958,122 | 9/1999 | Fukuda et al. | 106/31.57 |
| 5,968,674 | 10/1999 | Hsieh et al. | 428/690 |
| 5,969,733 | 10/1999 | Sheinman | 347/75 |
| 5,981,043 | 11/1999 | Murakami et al. | 428/209 |
| 5,982,404 | 11/1999 | Iga et al. | 347/173 |
| 5,990,197 | 11/1999 | Escano et al. | 523/160 |
| 6,036,295 | 3/2000 | Ando et al. | 347/7 |

* cited by examiner

INORGANIC OVERCOAT FOR PARTICULATE TRANSPORT ELECTRODE GRID

CROSS-REFERENCE TO RELATED APPLICATIONS

The present invention is related to U.S. patent application Ser. Nos. 09/163,893, 09/164,124, 09/164,250, 09/163,808, 09/163,765, 09/163,839, 09/163,954, 09/163,924, 09/163,904, 09/163,799, 09/163,664, 09/164,104, 09/163,825, issued U.S. Pat. Nos. 5,717,986, 5,893,015, 5,968,674, and 5,853,906, and U.S. patent application Ser. No. 09/128,160, each of the above being incorporated herein by reference.

BACKGROUND

The present invention relates to the field of overcoat materials, and more specifically relates to overcoat materials functioning as relaxation coatings applied to electrode grids.

There are known or proposed systems for electrostatically moving or assisting with the movement of fine particulate materials, such as marking material (e.g., toner) and the like. One such system is described in U.S. patent application Ser. No. 09/163,839.

According to the teachings of the aforementioned application Ser. No. 09/163,839, a grid of small and closely spaced electrodes are connected to a driver circuit such that a phased d.c. travelling electrostatic wave is established along the grid. Charged particulate material is transported by the electrostatic wave in a desired direction, at a desired velocity.

In such a system, it is desirable to provide a planarized surface over which the particulate material may travel. Such a surface eliminates the problem of particulate material becoming trapped between the electrodes. Furthermore, it is desirable to provide a material over the electrodes to provide rapid charge dissipation at a selected time constant. Arcing between electrodes must be prevented. Wear resistance is also a desired attribute of such a layer. Finally, it is important that such a layer be chemically stable. That is, the layer material must not react with the particulate material nor change characteristics in the presence of the operating environment. However, no known material to date has been able to optimize each of these desired attributes.

It is known to encapsulate electronic devices, such as integrated circuits, in protective coatings. Such coatings may provide physical protection from scratches, and a moisture barrier between the devices and the ambient environment. However, such materials are generally not used as top-surface dielectrics. Furthermore, such insulation and passivation layers typically have very high resistivities to avoid possible electrical shorts between covered leads.

Accordingly, there is a need in the art for a coating which provides a planarized surface, has a selected time constant, is wear resistant, and is chemically stable.

SUMMARY

The present invention is a novel coating for application over an electrode grid particle mover. The coating is an inorganic material which may be compatible with silicon processing, such as chemical vapor deposition (CVD) and may be incorporated into the production of silicon-based components such as an electrode grid.

The coating is a top-surface (that is, not sandwiched between layers) semiconducting dielectric, having a selected time constant to permit electric field charge and dissipation at a selected rate to permit particulate material movement over an underlying electrode grid.

According to one embodiment, the coating is a material selected from the group comprising: a nitride, an oxide, and an oxy-nitride of silicon, and amorphous silicon. The coating may be formed by CVD, plasma assisted CVD (PACVD), or other known processing techniques.

The time constant of the coating, as determined by the product of the dielectric constant and the resistivity of the material, is preferably between 0.5–100 microseconds (ms). Within this range of time constant, particulate material may be moved from electrode to electrode, across a grid of electrodes, at a speed about 1 to 2 meters per second (m/s). However, the larger the time constant, the slower the speed of movement of the particulate material across the electrode grid. The bulk resistivity of the coating is preferably between $1\times10^9$ and $1\times10^{12}$ ohm·centimeters (Ω·cm).

Thus, the present invention and its various embodiments provide numerous advantages discussed above, as well as additional advantages which will be described in further detail below.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described, such as pressures, temperatures, thicknesses, etc. These recited ranges are to be treated as examples only, and are not intended to limit the scope of the claims hereof. In addition, a number of materials are identified as suitable for various facets of the embodiments, such as for marking materials, layer materials, etc. These recited materials are also to be treated as exemplary, and are not intended to limit the scope of the claims hereof.

Figure 1:
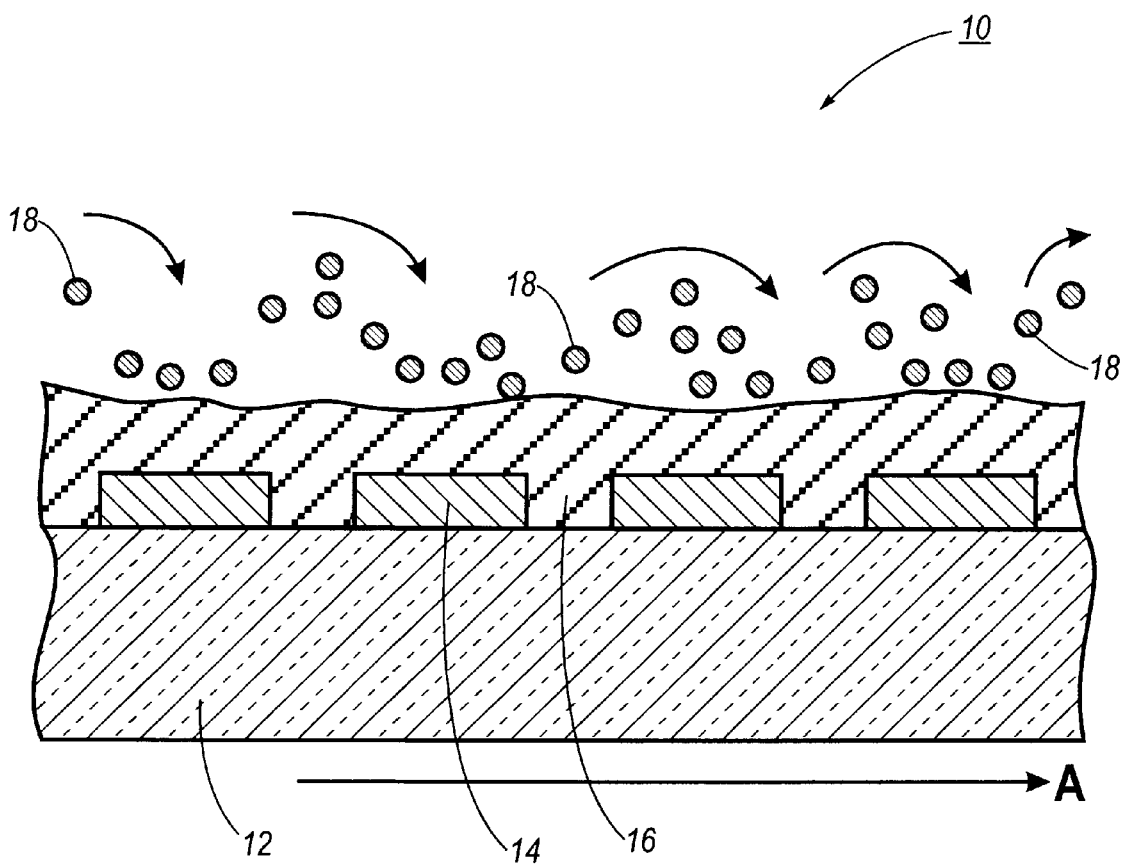
FIG. 1 is a cross-sectional illustration of a grid-type particulate particle mover having an overcoat thereon according to the present invention.

With reference now to FIG. 1, there is shown therein in cross-section one embodiment 10 of a grid of electrodes 14 formed on a substrate 12. Overlying the grid of electrodes 14 is an inorganic overcoat 16 according to the present invention. Other layers (not shown) may form a part of an embodiment of the type shown in FIG. 1, such as interface layers, electrical interconnection layers, etc. In addition, the geometry of an embodiment may vary from that shown in FIG. 1 (although not shown herein). For example electrodes may be formed to have a different profile, and may be formed in differing locations on the substrate. In any case, a traveling electrostatic wave produced by means not shown herein causes particulate material 18 to travel from electrode to electrode in the direction of arrow A.

Electrodes 14 are typically constructed of aluminum, although they may be formed of other materials. A common process for the formation of electrodes 14 is magnetron sputter deposition. Two important criteria for the overcoat of the present invention are that (1) the process used to form it not negatively affect the electrodes or substrate, and (2) that the material from which it is formed not negatively interact with the electrodes or the substrate. Thus, according to one embodiment of the present invention, the overcoat 16 is formed of silicon nitride by a plasma-assisted chemical vapor deposition (PACVD) process. PACVD is a low temperature process, the deposition taking place in the range of 300° C., which is well below the approximately 660° C. melting point of aluminum.

The desired resistivity of the silicon nitride film may be obtained by controlling the ratio of silicon to nitrogen. In one embodiment of the present invention, the ratio of silicon to nitrogen may be on the order of between 1.35:1.0 and 1.45:1.0, preferably 1.40:1.0. Other ratios, however, may still provide the time constant sought by the present invention.

The ultimate thickness of the overcoat layer will depend on the electrode metal thickness. For 0.6 μm thick metal electrodes, an overcoat layer thickness on the order of 0.5 to 1.0 μm will suffice although planarization may not be fully achieved. A layer thickness up to 4.0 μm or thicker may accomplish planarization and still serve to substantially provide the functions described herein.

Importantly, the silicon nitride overcoat will have a resistivity on the order of between $1 \times 10^9$ and $1 \times 10^{12}$ Ω–cm, and preferably between $1 \times 10^9$ Ω–cm and $1 \times 10^{10}$ Ω–cm, or even between $1 \times 10^9$ Ω–cm and $5 \times 10^9$ Ω–cm. This is significantly lower than the resistivity of a typical silicon nitride insulation or passivation layer, which would be on the order of $10^{14}$ to $10^{16}$ Ω–cm. The time constant (τ) for the overcoat is related to the resistivity (ρ) and the dielectric constant (ε), as:

$$\tau = \rho \cdot \varepsilon$$

A desired time constant for the proper establishment then dissipation of an electric field for particulate transport at a reasonable speed (1 to 2 m/s) is in the range of 0.5–100 ms. The dielectric constant of silicon nitride is in the range of 6 to 9. Thus, it is required that the resistivity be tailored to achieve the desired time constant. However, time constants up to, for example 1 second, are contemplated hereby, with the consequent reduction in particulate material transport speed. Indeed, a desired transport speed may be obtained by properly selecting the time constant of the layer (i.e., adjusting the resistivity).

While silicon nitride provides the desired control of resistivity (and hence the desired time constant), and is also compatible with current processes used to form the electrode grid (and potentially other layers and devices), it also provides scratch resistance, serves as a moisture barrier, and has low adhesion to many particulate materials, especially marking materials in marking device embodiments. However, a class of other materials may serve to function well as overcoat materials, providing some or all of the advantages discussed above. For example, an oxide of silicon, an oxy-nitride of silicon, and even amorphous silicon can provide many if not all of the above-mentioned advantages.

Figure 2:
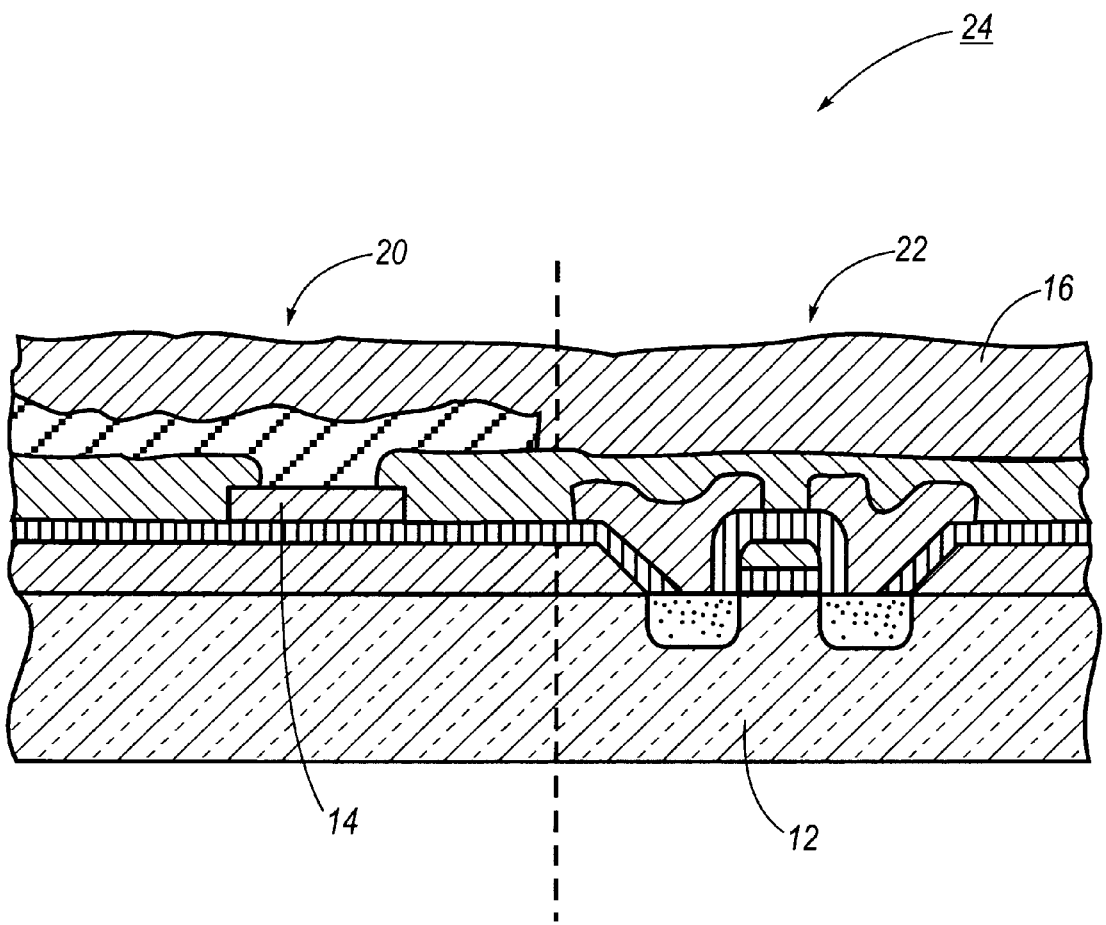
FIG. 2 is a cross-sectional illustration of a hybrid device, including both an electrode which is part of a particulate transport electrode grid, and a thin film transistor which may be used for driver, clock, logic or other circuitry.

Thus, while the present invention has been discussed in terms of one embodiment focussing on silicon nitride, it will be apparent to one skilled in the art that various embodiments of a coating for a particulate marking material transport device have been disclosed herein. Furthermore, while embodiments described and alluded to herein are capable providing an adequate overcoat for devices including electrode grids, such as particulate marking material movers, the present invention is not limited to marking material or particle movement, but may find applicability in a variety of other environments requiring an overcoat. For example, the overcoat may be applied over multiple devices to form on a substrate, such as the electrode grid 20 and thin-film transistor 22, of the embodiment 24 shown in FIG. 2. Thus, it should be appreciated that the description herein is merely illustrative, and should not be read to limit the scope of the invention nor the claims hereof.

What is claimed is:

1. An inorganic coating overlying an electrode grid, comprising:

a material selected from the group consisting of nitrides of silicon, oxides of silicon, oxy-nitrides of silicon, and amorphous silicon; and wherein said material has a time constant, a dielectric constant, and a resistivity, said time constant, determined by the product of the dielectric constant and the resistivity of the material, being between 0.5 microseconds and 1 second.

2. The inorganic coating of claim 1, wherein said time constant is between 1 and 100 microseconds.

3. The inorganic coating of claim 2, wherein said dielectric constant is between 6 and 9, and further wherein said resistivity is between $1 \times 10^9$ and $1 \times 10^{11}$ ohm–centimeters.

4. The inorganic coating of claim 1, wherein said material is silicon nitride having a bulk resistivity between $1 \times 10^9$ and $1 \times 10^{11}$ ohm·centimeters.

5. The inorganic coating of claim 4, wherein said silicon nitride has a bulk resistivity between $1 \times 10^9$ and $5 \times 10^9$ ohm·centimeters.

6. The inorganic coating of claim 1, wherein said material is silicon nitride having a ratio of silicon to nitrogen of between 1.25:1.0 and 1.45:1.0.

7. The inorganic coating of claim 6, wherein the ratio of silicon to nitrogen is 1.40:1.0.

8. An inorganic coating overlying an electrode grid for particulate material transport, comprising:

a layer of silicon nitride having a bulk resistivity between $1 \times 10^9$ and $1 \times 10^{11}$ ohm·centimeters, and a time constant, as determined by the product of a dielectric constant of the material and the bulk resistivity of the material, between 1 and 100 microseconds, said layer being between 0.5 μm and 1.0 μm thick.

* * * * *